US012727103B2

(12) United States Patent
Shimizu et al.

(10) Patent No.: US 12,727,103 B2
(45) Date of Patent: Sep. 1, 2026

(54) CASE AND SEAL

(71) Applicant: Murata Manufacturing Co., Ltd., Nagaokakyo (JP)

(72) Inventors: Yasuhiro Shimizu, Nagaokakyo (JP); Kiyoyuki Nakagawa, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 253 days.

(21) Appl. No.: 18/534,792

(22) Filed: Dec. 11, 2023

(65) Prior Publication Data

US 2024/0107686 A1 Mar. 28, 2024

Related U.S. Application Data

(63) Continuation of application No. PCT/JP2022/016824, filed on Mar. 31, 2022.

(30) Foreign Application Priority Data

Jun. 17, 2021 (JP) ................................ 2021-101118

(51) Int. Cl.
*H05K 5/10* (2025.01)
*H05K 5/02* (2006.01)
*H05K 13/02* (2006.01)

(52) U.S. Cl.
CPC ............. *H05K 5/10* (2025.01); *H05K 5/0217* (2013.01); *H05K 13/028* (2013.01)

(58) Field of Classification Search
CPC ...... H05K 5/10; H05K 5/0217; H05K 13/028; H05K 13/0434; B65D 83/04; B65D 25/38
See application file for complete search history.

(56) References Cited

U.S. PATENT DOCUMENTS 5,713,489 A * 2/1998 Loos ...................... B65D 83/02 221/205
6,116,840 A * 9/2000 Saito ..................... B23P 19/004 221/292
6,997,320 B1 2/2006 Kancsar et al.
(Continued)

FOREIGN PATENT DOCUMENTS

CN 208746650 U 4/2019
JP 08167792 A 6/1996
(Continued)

OTHER PUBLICATIONS

Machine translation og JPH11150395 (Year: 2025).*
(Continued)

*Primary Examiner* — Sagar Shrestha
(74) *Attorney, Agent, or Firm* — Keating & Bennett, LLP

(57) ABSTRACT

A case includes a case body including an accommodation space to accommodate electronic components and a discharge port to discharge the electronic components accommodated in the accommodation space, a shutter slidable relative to the case body to open and close the discharge port, a slider integral with the shutter to perform a slide operation of the shutter, and an operation opening in the case body to expose the slider to outside to allow for operation of the slider. A seal including a portion that covers and seals at least the operation opening is attachable to the case body.

20 Claims, 7 Drawing Sheets

(56) References Cited

U.S. PATENT DOCUMENTS

| | | | | |
|---|---|---|---|---|
| 2007/0176410 | A1* | 8/2007 | Unglert | G09F 3/10<br>283/67 |
| 2014/0097195 | A1* | 4/2014 | Anthony | G16H 20/13<br>221/13 |
| 2019/0127133 | A1 | 5/2019 | Rossi | |

FOREIGN PATENT DOCUMENTS

| | | | |
|---|---|---|---|
| JP | 1117391 | A | 1/1999 |
| JP | 11150395 | A | 6/1999 |
| JP | 2000277982 | A | 10/2000 |
| JP | 2002274593 | A | 9/2002 |
| JP | 2003501326 | A | 1/2003 |
| JP | 2003152390 | A | 5/2003 |
| JP | 2007522501 | A | 8/2007 |
| JP | 2009295618 | A | 12/2009 |

OTHER PUBLICATIONS

Official Communication issued in corresponding Chinese Patent Application No. 202280040347.1, mailed on Aug. 2, 2025, 7 pages.
International Search Report in PCT/JP2022/016824, mailed Jun. 21, 2022, 3 pages.
Written Opinion in PCT/JP2022/016824, mailed Jun. 21, 2022, 4 pages.

* cited by examiner

Z1
Z
Z2
Y1
Y
Y2
3
4
5
10
11
12
13
14
17
17a
17c
18
19
25
26
26a
26b
26c
27
28A
29
30
31
35
35a
36
37
41
51
52
53
54
61
62
70
71

Z
Z1
Z2
Y
Y1
Y2
3
4
5
10
11
12
13
14
17
17a
17c
18
19
25
26
26a
26b
26c
27
28A
29
30
31
35
35a
36
37
39
41
51
52
53
54
61
62
70
71

CASE AND SEAL

CROSS REFERENCE TO RELATED APPLICATIONS

This application claims the benefit of priority to Japanese Patent Application No. 2021-101118 filed on Jun. 17, 2021 and is a Continuation Application of PCT Application No. PCT/JP2022/016824 filed on Mar. 31, 2022. The entire contents of each application are hereby incorporated herein by reference.

BACKGROUND OF THE INVENTION

1. Field of the Invention

The present invention relates to a case to accommodate electronic components such as chip components, and a seal attached to such a case.

2. Description of the Related Art

When mounting electronic components on a substrate, a mounting device is used to mount each of the electronic components at a predetermined position on the substrate. It is necessary to supply electronic components individually to such a mounting device. For example, Japanese Unexamined Patent Application Publication No. 2009-295618 discloses a case in which electronic components in a loose state are collectively accommodated, and the electronic components are dropped onto a feeder by their own weight from a take-out port at a bottom portion thereof. The electronic components are individually supplied to the mounting device by the feeder.

SUMMARY OF THE INVENTION

In a case such as that disclosed in Japanese Unexamined Patent Application Publication No. 2009-295618, if different kinds of electronic components are mixed, the types of electronic components to be mounted are different, so that it is necessary to avoid mixing. Different types of electronic components are mixed from the discharge port of the opened case. Therefore, it is desirable to be able to determine whether or not the case has been opened. This is because, if it is determined that the case has been opened, it can be determined that there is a possibility that different types of electronic components may be mixed in the case.

Example embodiments of the present invention provide cases each capable of determining whether or not the case has been opened.

An example embodiment of the present invention provides a case including a case body including an accommodation space to accommodate a plurality of components and a discharge port to discharge the plurality of components accommodated in the accommodation space, a shutter slidably provided in the case body to open and close the discharge port, a slider integral with the shutter to perform a slide operation of the shutter, and an operation opening in the case body to expose the slider to outside to allow for operation of the slider, in which a seal including a sealing seal portion to cover and seal at least the operation opening is attachable to the case body.

An example embodiment of the present invention provides a seal attachable to a case that includes a case body including an accommodation space to accommodate a plurality of components and a discharge port to discharge the plurality of components accommodated in the accommodation space, a shutter slidably provided in the case body to open and close the discharge port, a slider integral with the shutter to perform a slide operation of the shutter, and an operation opening in the case body to expose the slider to outside to allow for operation of the slider. The seal includes a sealing seal portion to cover and seal at least the operation opening, and an additional seal portion attachable to a portion on a surface of the case body, in which the additional seal portion displays information relating to at least one of the plurality of components or the case.

According to example embodiments of the present invention, it is possible to provide cases each capable of determining whether or not the case has been opened.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Figure 1:
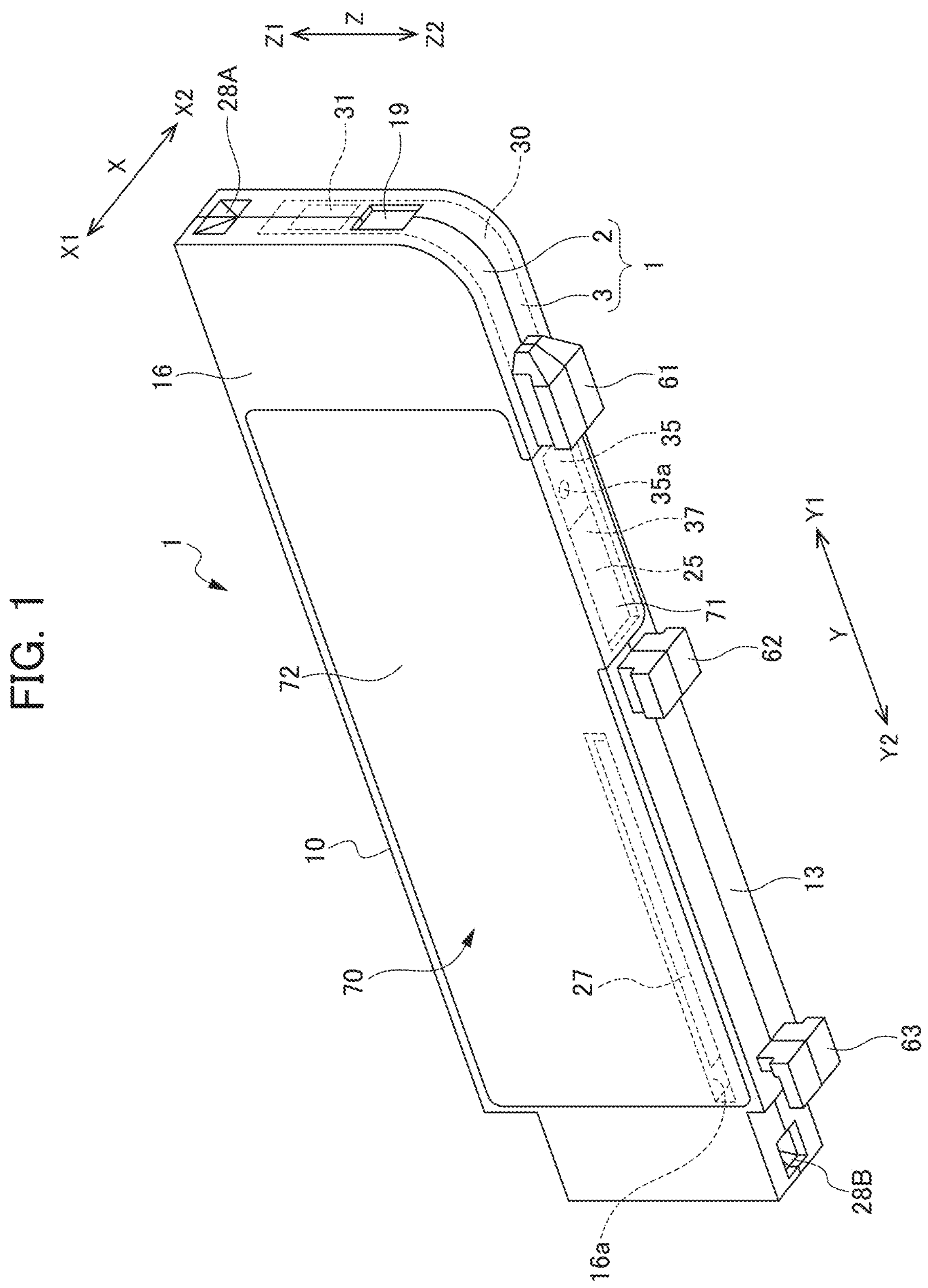
FIG. 1 is a perspective view of a case according to an example embodiment as viewed from below.
Figure 2:
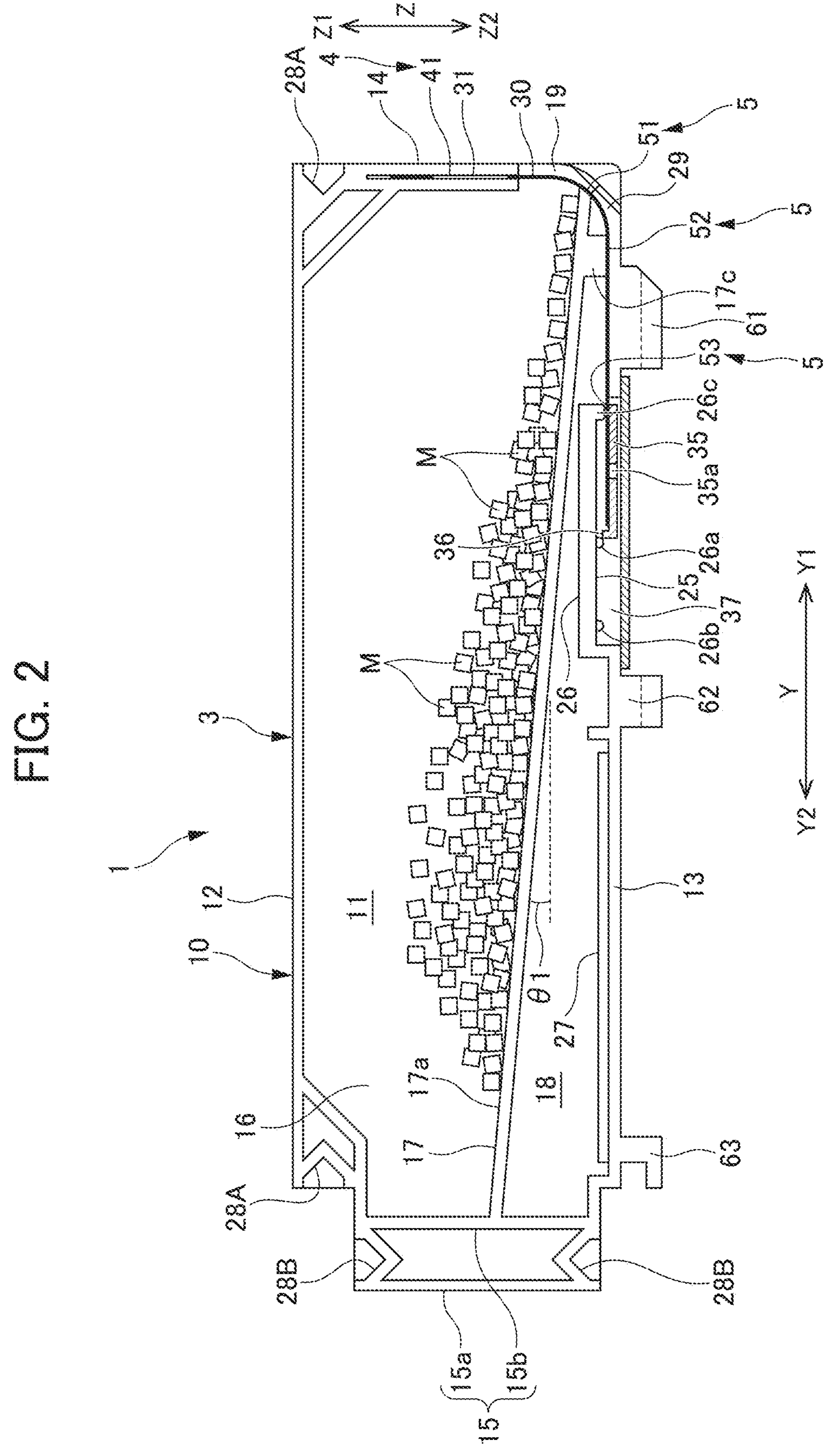
FIG. 2 is a lateral view of an inside of a case according to an example embodiment of the present invention.
Figure 3:
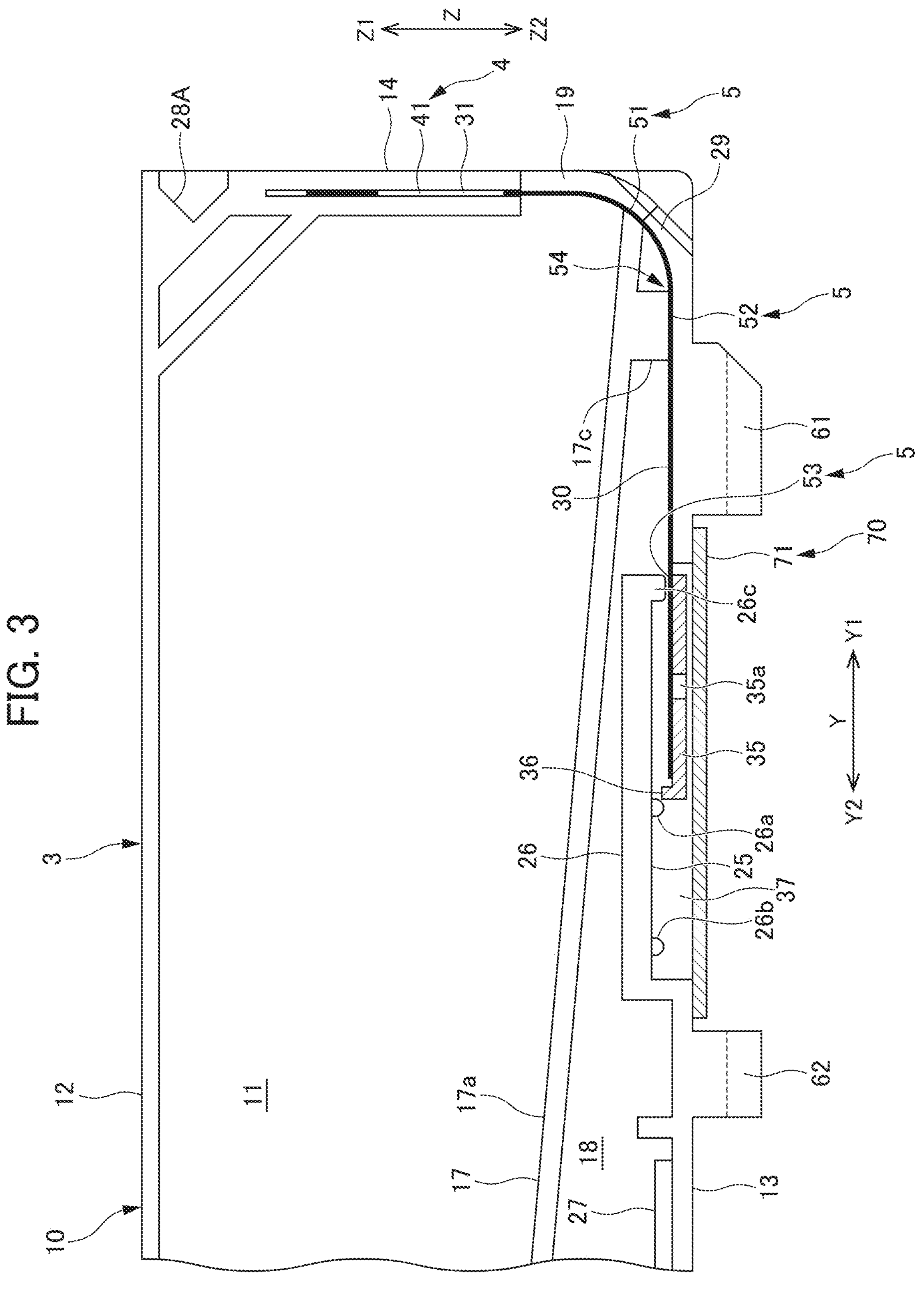
FIG. 3 is an enlarged lateral view of an inside of a front portion of a case according to an example embodiment of the present invention, and showing a state in which a discharge port is closed by a shutter.

Hereinafter, example embodiments of the present invention will be described. FIG. 1 is a perspective view of a case 1 according to an example embodiment as viewed from below. FIG. 2 is a lateral view of the inside of the case 1 according to the present example embodiment. FIG. 3 is an enlarged lateral view showing the inside of a front portion of the case 1.

As shown in FIG. 2, the case 1 accommodates therein a plurality of electronic components M as components in a loose state. The case 1 including the plurality of electronic components M is set in a feeder (not shown), and the electronic components M are discharged from the case 1 by vibration of the feeder and supplied to a mounting device or the like. Each of the electronic components M of the present example embodiment is, for example, a rectangular or substantially rectangular parallelepiped electronic component having a length of about 1.2 mm or less in the longitudinal direction. Examples of such electronic components include capacitors and inductors, but the present example embodiment is not limited thereto.

Arrows X, Y, and Z in any one of FIGS. 1, 2, and 3 respectively indicate the left-right direction, the front-rear direction, and the up-down direction of the case 1 in the use state set in the feeder. Further, the left side in the left-right direction X is denoted by X1, the right side is denoted by X2, the front side in the front-rear direction Y is denoted by Y1, the rear side is denoted by Y2, the upper side in the up-down direction Z is denoted by Z1, and the lower side is denoted by Z2. The left-right direction X, the front-rear direction Y, and the up-down direction Z are similarly applied to FIG. 4 as well. The left-right direction, the front-rear direction, and the up-down direction in the following description are based on the directions indicated by the arrows.

As shown in FIG. 1, the case 1 includes a first member 2 and a second member 3 which are divided into left and right. The first member 2 and the second member 3 are joined to each other to define the case 1.

FIG. 2 shows a state in which the first member 2 on the left side is absent, and shows the inside of the second member 3 on the right side. The case 1 has a flat box shape that is long in the front-rear direction and thin in the left-right direction. In the following description, except where necessary, the first member 2 and the second member 3 are not individually described, and the configuration in a state in which the first member 2 and the second member 3 are joined to each other will be described.

As shown in FIGS. 1 and 2, the case 1 includes a case body 10 that accommodates a plurality of electronic components M, a shutter 30 that opens and closes a discharge port 19 from which the electronic components M are discharged, a slider 35 that performs a slide operation of the shutter 30, and an operation opening 37 that exposes the slider 35 to the outside of the case body 10 to operate the slider 35.

The case body 10 includes a top plate portion 12 and a bottom plate portion 13 which extend in the front-rear direction, a front wall portion 14 and a rear wall portion 15 which extend in the up-down direction, a pair of left and right lateral wall portions 16, and an sloped plate portion 17 which partitions the inside of the case body 10 vertically. The rear wall portion 15 includes an outer rear wall portion 15*a* defining or functioning as an outer surface and an inner rear wall portion 15*b* in front of the outer rear wall portion. An accommodation space 11 to accommodate the plurality of electronic components M in a loose state is provided inside the case body 10.

The discharge port 19 is provided below the front wall portion 14. As shown in FIG. 1, the discharge port 19 includes a rectangular or substantially rectangular opening. The discharge port 19 is not limited to a rectangular or substantially rectangular shape, and may be, for example, an opening having a circular shape, an elliptical shape, or the like. The discharge port 19 is opened and closed by the shutter 30.

The sloped plate portion 17 extends between the left and right lateral wall portions 16 and extends from the inner rear wall portion 15*b* to the lower portion of the discharge port 19. The sloped plate portion 17 is provided below the center of the case body 10 in the up-down direction. In the case body 10, the upper side of the sloped plate portion 17 defines and functions as the accommodation space 11, and the lower side of the sloped plate portion 17 defines and functions as the lower space 18.

The sloped plate portion 17 is sloped at a downward gradient toward the discharge port 19, and an upper surface of the sloped plate portion 17 defines and functions as a sloped surface 17*a* which is sloped at a downward gradient toward the discharge port 19. In this example embodiment, the slope angle θ1 of the sloped surface 17*a* is about 10°, for example, with respect to the horizontal direction when the case 1 is set in the feeder. The slope angle θ1 of the sloped surface 17*a* is preferably about 3° or more and about 10° or less, for example. The slope angle θ1 of the sloped surface 17*a* is appropriately adjusted according to the vibration condition of the feeder, for example.

As shown in FIG. 1, a band-shaped RFID tag 27 elongated in the front-rear direction is provided at a rear portion of the lower space 18. The RFID tag 27 is, for example, configured in a sticker form, and is attached to the upper surface of the bottom plate portion 13. As shown in FIG. 1, the RFID tag 27 is stored in the lower space 18 through a hole 16*a* provided in the lateral wall portion 16 and extending in the front-rear direction. The RFID tag 27 has a known configuration including a transmission/reception unit, memory, an antenna, and the like. For example, a reader/writer that reads and writes information from and to the RFID tag 27 is provided in the feeder in which the case 1 is set.

The case body 10 includes upper grip portions 28A and rear grip portions 28B. The upper grip portions 28A include a pair of front and rear recesses provided at both front and rear ends of the upper side of the case body 10. The rear grip portions 28B include a pair of upper and lower recesses provided at both upper and lower ends of the rear side of the case body 10. Each of the upper grip portions 28A and the rear grip portions 28B is gripped by the robot hand, for example, when the case 1 is carried by the robot hand.

The case body 10 includes a plurality of claw portions on the bottom surface for detachably setting the case body 10 to the feeder. In the present example embodiment, a first claw portion 61, a second claw portion 62, and a third claw portion 63 are provided on the bottom surface at intervals in the front-rear direction. The first claw portion 61, the second claw portion 62, and the third claw portion 63 are provided integrally with the case body 10. Each of the first claw portion 61 and the second claw portion 62 is configured by a T-shaped slot having an inverted T-shape in a cross section in a plane extending in the up, down, left, and right directions. The third claw portion 63 is an L-shaped plate piece extending rearward in a lateral view.

As shown in FIG. 2, a rectangular or substantially rectangular recess 25 extending in the front-rear direction is provided in the lower surface of the case body 10. The recess 25 is provided between the first claw portion 61 and the second claw portion 62 and is recessed upward. The lower opening of the recess 25 defines and functions as an operation opening 37. The bottom plate portion 13 includes a stepped plate portion 26 positioned on the back side of the recess 25, i.e., on the upper side. The recess 25 is provided below the stepped plate portion 26. On the rear side of the lower surface of the stepped plate portion 26, a front protruding portion 26*a* and a rear protruding portion 26*b* each protruding downward are provided in a pair in the front-rear direction. A guide protrusion 26*c* protruding downward is provided at a front end portion of a lower surface of the stepped plate portion 26. The guide protrusion 26*c* defines and functions as a third lower guide portion 53 described later.

The shutter 30 continuously extends from the bottom plate portion 13 to the front wall portion 14, and is slidable along the extending direction. The shutter 30 includes an elongated strip-shaped film. The shutter 30 is made of a flexible material having a certain degree of rigidity and bendable, such as PET (polyethylene terephthalate). The width of the shutter 30 is slightly larger than the width of the discharge port 19, and has a width capable of covering the discharge port 19 without any gap. An opening 31 having substantially the same shape as the discharge port 19 is provided at the front end of the shutter 30. The shutter 30 slides to open and close the discharge port 19. Specifically, in the range in which the shutter 30 slides, when the opening 31 coincides with the discharge port 19, the discharge port 19 opens, and when the opening 31 is provided above the discharge port 19, the discharge port 19 is closed by the shutter 30.

The shutter 30 can slide along the lower guide portion 5 and the upper guide portion 4 of the case body 10. The lower guide portion 5 is provided above the bottom plate portion 13, and the upper guide portion 4 is provided above the discharge port 19. The rear side of the shutter 30 slides substantially horizontally along the lower guide portion 5, and the front side of the shutter 30 slides vertically along the upper guide portion 4. Each of the lower guide portion 5 and the upper guide portion 4 provides a passage to slidably hold the shutter 30 while maintaining the surface direction of the shutter 30 along the left-right direction.

As shown in FIG. 3, the lower guide portion 5 includes a first lower guide portion 51 provided below the discharge port 19, a second lower guide portion 52 provided on the rear side of the first lower guide portion 51, and a third lower guide portion 53 provided on the rear side of the second lower guide portion 52.

The third lower guide portion 53 includes the guide protrusion 26*c* provided on the front end portion of the lower surface of the stepped plate portion 26. The second lower guide portion 52 includes a gap 54 provided between a protruding portion 17*c* that projects downward at the front end portion of the sloped plate portion 17, and the front end portion of the bottom plate portion 13. The first lower guide portion 51 includes a front end surface of the sloped plate portion 17 and a front end portion 29 of the bottom plate portion 13.

The shutter 30 slides on the lower surface of the guide protrusion 26*c* in the third lower guide portion 53 and passes through the gap 54 provided between the protruding portion 17*c* and the bottom plate portion 13 in the second lower guide portion 52. With such a configuration, the rear side of the shutter 30 slides in the front-rear direction along the bottom plate portion 13. In the first lower guide portion 51, the shutter 30 slides along the front end portion 29 of the bottom plate portion 13 which curves concavely in the front-rear direction, and further slides along the front end surface of the sloped plate portion 17, such that the shutter 30 bends upward at an angle of, for example, approximately 90° from the horizontal direction, and is converted into a posture extending in the up-down direction. The shutter 30 slides in the up-down direction above the third lower guide portion 53.

As shown in FIG. 3, the upper guide portion 4 includes a slit 41 provided in the front wall portion 14 and extending in the up-down direction. The front end portion of the shutter 30 enters the slit 41 from the lower end of the front wall portion 14, and slides in the slit 41.

As shown in FIG. 3, the slider 35 is provided at the rear end of the shutter 30. The slider 35 is a rectangular or substantially rectangular plate piece elongated in the front-rear direction. The slider 35 slides the shutter 30 to open and close the discharge port 19. The slider 35 is provided on the lower surface of the shutter 30, and is fixed integrally with the shutter 30. A pin hole 35*a* penetrating in the vertical direction is provided in the center of the slider 35. An operation pin 39 for a slide operation described later is insertable into the pin hole 35*a*.

The slider 35 is slidably provided in the front-rear direction in the recess 25. The slider 35 is slidably provided in the front-rear direction with, for example, a structure in which flange-shaped plate pieces extending in the front-rear direction, which are provided on both lateral surfaces of the slider 35, are inserted into grooves provided on inner surfaces of both lateral wall portions 16 and are slid.

The slider 35 provided in the recess 25 is exposed to the outside on the lower side through the operation opening 37 of the recess 25. The operation opening 37 has a length in the front-rear direction in which at least the pin hole 35*a* is always exposed from a position where the slider 35 slides forward and the discharge port 19 is closed by the shutter 30 to a position where the slider 35 slides rearward and the opening 31 matches the discharge port 19 and the discharge port 19 is opened.

The slider 35 includes a stopper 36 to position the slide position of the shutter 30 at two positions, i.e., a position where the opening 31 of the shutter 30 matches the discharge port 19 and the discharge port 19 is opened, and a position where the opening 31 moves above the discharge port 19 and the shutter 30 closes the discharge port 19. As shown in FIG. 3, the stopper 36 includes a protruding portion that is provided at the rear end portion of the upper surface of the slider 35 and projects upward.

Figure 4:
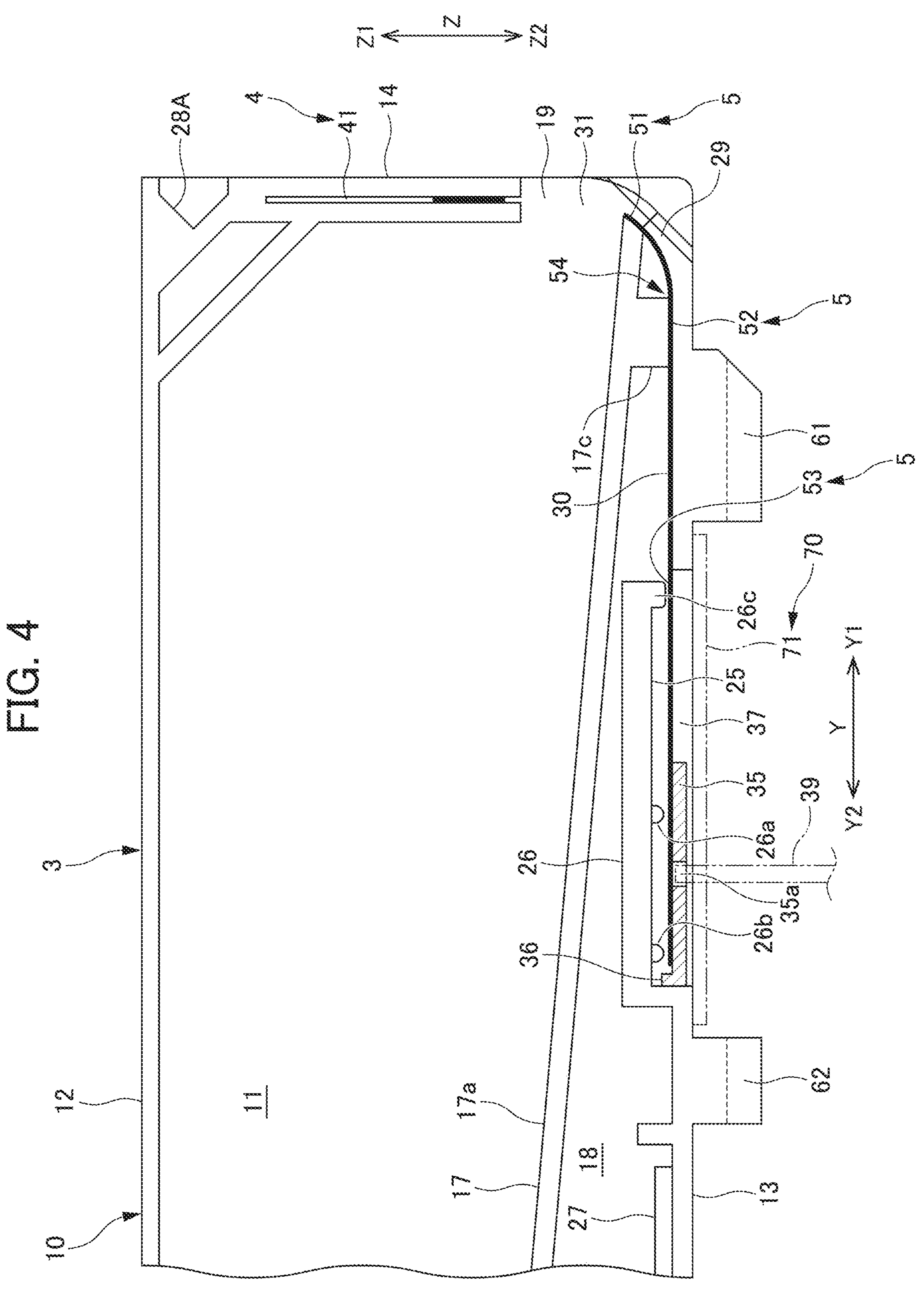
FIG. 4 is an enlarged lateral view of an inside of a front portion of a case according to an example embodiment of the present invention, and showing an open state in which a discharge port is opened.

The stopper 36 is brought into contact with one of the front protruding portion 26*a* and the rear protruding portion 26*b* provided on the stepped plate portion 26. As shown in FIG. 3, when the slider 35 moves forward so that the stopper 36 is located more forwards than the front protruding portion 26*a*, the opening 31 is positioned in the slit 41 above the discharge port 19, and the discharge port 19 is closed by the shutter 30. As shown in FIG. 4, when the slider 35 moves rearward so that the stopper 36 is located farther rearward than the rear protruding portion 26*b*, the opening 31 matches the discharge port 19 and the discharge port 19 opens. The electronic components M accommodated in the accommodation space 11 passes through the open discharge port 19 and are discharged from the case 1. The slider 35 can be slid by operating the operation pin 39 inserted into the pin hole 35*a*.

Figure 5A:
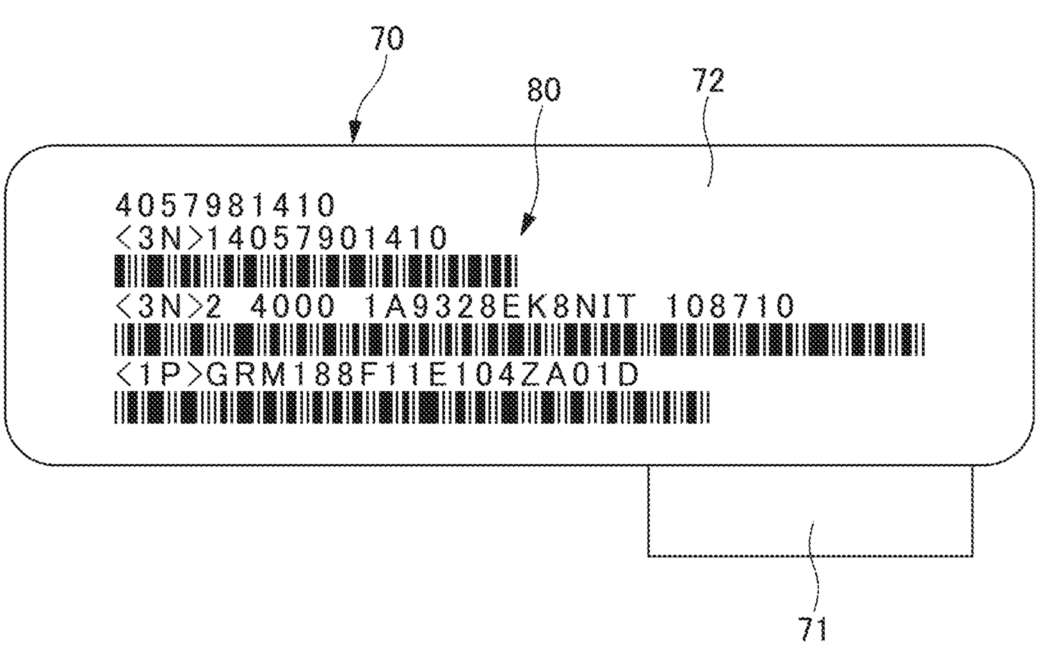
FIG. 5A shows a seal according to an example embodiment of the present invention.

As shown in FIG. 1, in the case 1 of the present example embodiment, a seal 70 is attached to the case body 10. As shown in FIG. 5A, the seal 70 includes a sealing seal portion 71 and an additional seal portion 72 continuous with the sealing seal portion 71. The sealing seal portion 71 is attached to the bottom surface of the case body 10 so as to cover the operation opening 37. The operation opening 37 is sealed and closed by the sealing seal portion 71. With such a configuration, the recess 25 and the slider 35 cannot be visually recognized from the outside. The seal 70 is a seal having a general structure in which an adhesive layer is provided on one side of a sheet-shaped base material made of resin, paper, or the like, and a release sheet is attached to the adhesive layer before being attached to the case body 10.

As shown in FIG. 1, the additional seal portion 72 of the present example embodiment is attached to the surface of the left lateral wall portion 16 of the case body 10. The additional seal portion 72 of the present example embodiment has a size that covers about 70%, for example, of the lateral wall portion 16, and is attached to the lateral wall portion 16 while leaving the front end portion and the rear end portion of the lateral wall portion 16. The additional seal portion 72 of the seal 70 is attached to the lateral wall portion 16 and the sealing seal portion 71 of the seal 70 is bent approximately 90 degrees, for example, toward the bottom surface side such that the seal 70 is attached to the surface of the bottom plate portion 13 around the operation opening 37.

As shown in FIG. 5A, an indicator 80 is printed on the additional seal portion 72. The indicator 80 shows information on the electronic components M and information on the case 1. Examples of the information on the electronic component M include a type of component, a lot number, a manufacturing date, a manufacturing factory, and an inspection number. Examples of the information on the case 1 include a case number and the number of the electronic components M accommodated. The indicator 80 of the present example embodiment is a code by a combination of numerals and alphanumeric characters (alphabet) and a bar code. However, the indicator 80 is not limited thereto. The indicator 80 may be only information on the electronic components M or may be only information on the case 1.

When the shutter 30 is slid to open the discharge port 19, the sealing seal portion 71 is detached from the case body 10 to open the operation opening 37, and the operation pin 39 is inserted into the pin hole 35*a* of the slider 35 exposed from the operation opening 37. When the pin hole 35*a* is moved rearward to slide the slider 35 rearward, the shutter 30 slides rearward, and the opening 31 matches the discharge port 19 to open the discharge port 19. Alternatively, the operation pin 39 may be inserted into the sealing seal portion 71 to penetrate the sealing seal portion 71, the operation pin 39 may be inserted into the pin hole 35*a* of the slider 35, and the slider 35 may be slid rearward while tearing the sealing seal portion 71 by the operation pin 39.

According to the case 1 of the present example embodiment, the slider 35 cannot be accessed without peeling off and removing the sealing seal portion 71 or tearing and breaking the sealing seal portion 71. Therefore, it is possible to determine that the discharge port 19 has been opened when the sealing seal portion 71 has been peeled off or torn. Since the slider 35 is provided with the pin hole 35*a* into which the operation pin 39 can be inserted, the slider 35 can be easily slid by the operation pin 39, and the discharge port 19 can be smoothly opened.

Figure 5B:
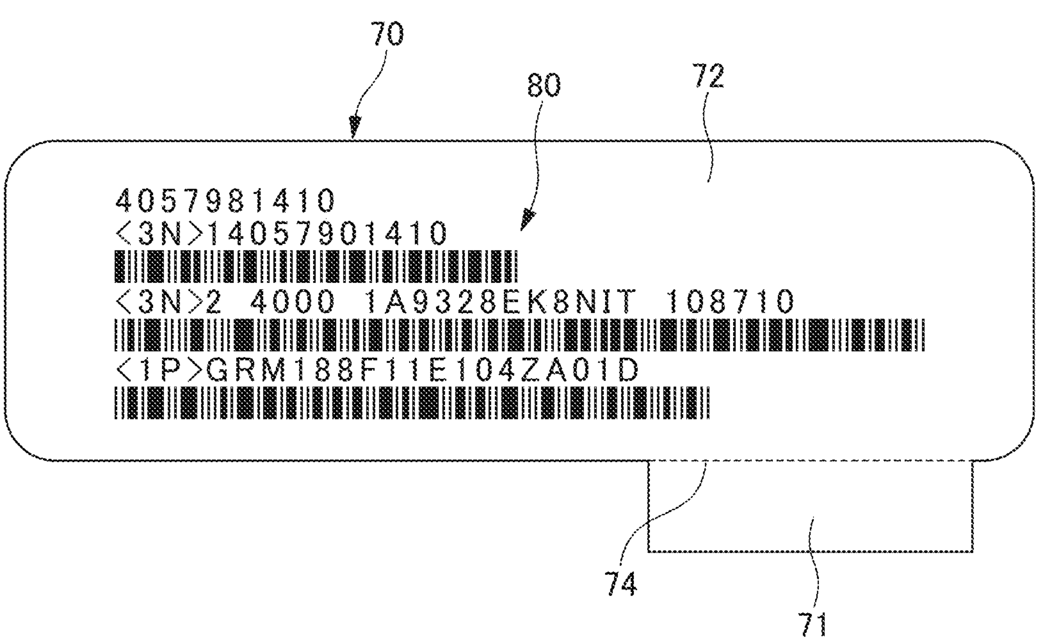
FIG. 5B is a diagram of a modified example in which a seal according to an example embodiment of the present invention has perforations at the boundary between a sealing seal portion and an additional seal portion.

As shown in FIG. 5B, it is preferable to provide in advance perforations 74 including a large number of fine cuts provided linearly at the boundary between the sealing seal portion 71 and the additional seal portion 72. With such a configuration, the sealing seal portion 71 is peelable from the case body 10 by cutting the perforations 74. As a result, only the sealing seal portion 71 can be peeled and separated from the case body 10, such that it is possible to reduce or prevent a cut or perforation in the additional seal portion 72 to break the indication 80.

Figure 5C:
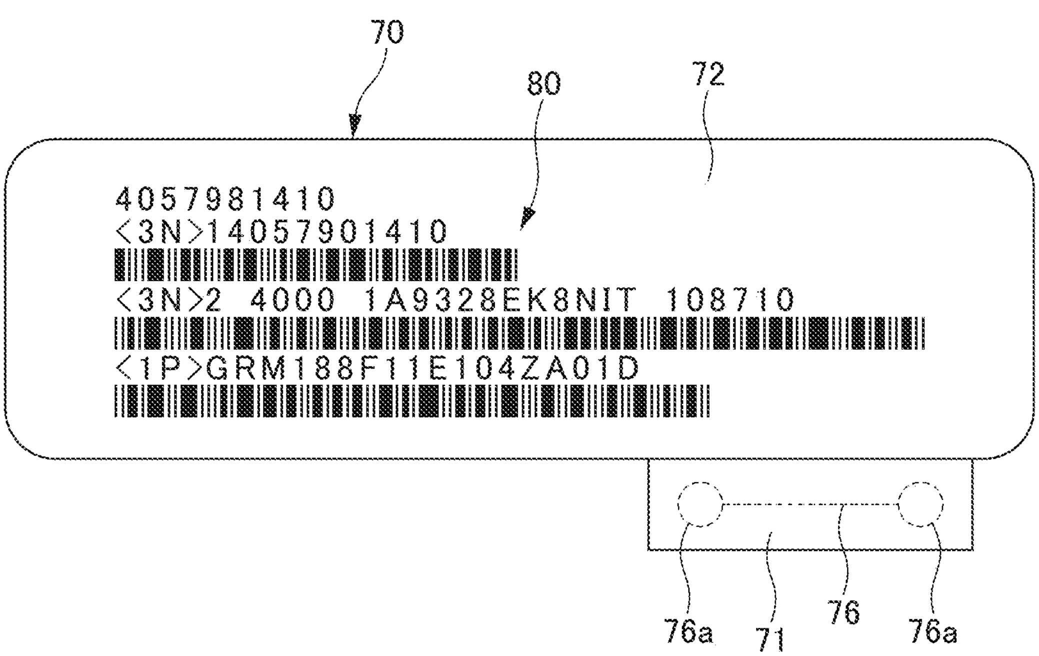
FIG. 5C is a view of a modified example in which a seal according to an example embodiment of the present invention has a weakened line portion in a sealing seal portion.

When the operation pin 39 is caused to penetrate the sealing seal portion 71 as described above, it is preferable that a linear weakened line portion 76 extending along the front-rear direction and functioning as a weakened line portion is provided in advance in the middle of the sealing seal portion 71, as shown in FIG. 5C. The linear weakened line portion 76 is provided so as to correspond to a position and a length corresponding to the operating range of the slider 35. At both ends of the linear weakened line portion 76, circular weakened line portions 76*a* that facilitate penetration of the operation pin 39 are respectively provided continuously with the linear weakened line portion 76.

When the sealing seal portion 71 is torn by the operation pin 39, the sealing seal portion 71 is easily torn by moving the operation pin 39 along the linear weakened line portion 76, such that it is possible to smoothly perform the opening operation.

The weakened line portion such as the linear weakened line portion 76 may include perforations having a large number of fine cuts provided linearly. The weakened line portion may include a slit. Examples of the slit include a plurality of kinds of slits such as a slit which is a gap having a width that can be visually recognized, a slit which is a simple linear cut, and a micro-slit having an extremely small width. In addition, the weakened line portion may include an easy-opening structure which is processed so as to be capable of being broken from any portion by providing many unrecognizable fine cuts.

In the present example embodiment, it is preferable to include a seal having a configuration of an anti-opening seal (or a tampering prevention seal) in which, for example, a peeling mark is transferred to the surface of the case body 10 when the sealing seal portion 71 is peeled off from the case body 10. With such a configuration, even when the sealing seal portion 71 has been peeled off, it can be determined that the sealing seal portion 71 had been attached thereto before and, therefore, it is possible to determine that there is a possibility that the discharge port 19 has been opened.

According to the cases of the example embodiments having the above configurations, it is possible to achieve the following advantageous effects.

One of the cases 1 according to an example embodiment includes the case body 10 including the accommodation space 11 to accommodate the plurality of electronic components M and the discharge port 19 to discharge the plurality of electronic components M accommodated in the accommodation space 11, the shutter 30 slidably provided in the case body 10 to open and close the discharge port 19, the slider 35 integral with the shutter 30 to perform a slide operation of the shutter 30, and the operation opening 37 in the case body 10 to expose the slider 35 to outside, to allow for operation of the slider 35. The seal 70 including the sealing seal portion 71 that covers and seals at least the operation opening 37 is attachable to the case body 10.

With such a configuration, it is possible to determine whether or not the discharge port 19 has been opened based on the state of the sealing seal portion 71.

In a case 1 according to an example embodiment, it is preferable that the slider 35 includes the pin hole 35*a* into which the operation pin 39 for a slide operation is inserted, and that the sealing seal portion 71 includes the linear weakened line portion 76 functioning as a weakened line portion extending along the operating range of the slider 35. Examples of the linear weakened line portion 76 include perforations having a large number of fine cuts provided linearly, and slits which are simple linear cuts.

With such a configuration, when the sealing seal portion 71 is torn by the operation pin 39, it is possible to easily tear the sealing seal portion 71 by moving the operation pin 39 along the linear weakened line portion 76, and it is possible to smoothly operate the opening operation.

In a case 1 according to an example embodiment, it is preferable that the sealing seal portion 71 is peelable from the case body 10, and when the sealing seal portion 71 is peeled off, a peeling mark is transferred to the surface of the case body 10.

With such a configuration, even when the sealing seal portion 71 has been peeled off, it can be determined that the sealing seal portion 71 had been attached thereto before and, therefore, it is possible to determine that there is a possibility that the discharge port 19 has been opened.

In a case 1 according to an example embodiment, the seal 70 includes the additional seal portion 72 that is continuous with the sealing seal portion 71 and attachable to the surface of the lateral wall portion 16 defining and functioning as a portion of the case body 10, and the additional seal portion 72 displays, as the indication 80, information relating to at least one of the electronic components M or the case 1.

With such a configuration it is possible to display the information on the electronic component M and the case 1 on the case 1 together with the sealing seal portion 71, thus facilitating management of the electronic component M and the case 1.

Further, a seal 70 attachable to the case 1 according to an example embodiment is provided. The case 1 includes the case body 10 including the accommodation space 11 to accommodate the plurality of electronic components M and the discharge port 19 to discharge the plurality of electronic components M accommodated in the accommodation space 11, the shutter 30 slidably provided in the case body 10 to open and close the discharge port 19, the slider 35 integral with the shutter 30 to perform a slide operation of the shutter 30, and the operation opening 37 in the case body 10 to expose the slider 35 to outside to allow for operation of the slider 35. The seal includes the sealing seal portion 71 to cover and seal at least the operation opening 37, and the additional seal portion 72 attachable to the surface of the lateral wall portion 16 functioning as a portion of the case body 10. The additional seal portion 72 displays information relating to at least one of the electronic components M or the case 1.

According to a seal 70 of an example embodiment, it is possible to determine whether or not the discharge port 19 of the case 1 has been opened by the sealing seal portion 71, and it facilitates managing the electronic component M and the case 1 based on the information displayed on the additional seal portion 72.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A case comprising:

a case body including an accommodation space to accommodate a plurality of components and a discharge port to discharge the plurality of components accommodated in the accommodation space;

a shutter slidably provided in the case body to open and close the discharge port;

a slider integral with the shutter to perform a slide operation of the shutter; and an operation opening in the case body to expose the slider to outside to allow for operation of the slider; wherein a seal including a sealing seal portion to cover and seal at least the operation opening is attachable to the case body.

2. The case according to claim 1, wherein the slider includes a pin hole into which an operation pin for a slide operation is to be inserted; and the sealing seal portion includes a weakened line portion that extends along an operating range of the slider.

3. The case according to claim 2, wherein the weakened line portion includes perforations including cuts linearly arranged.

4. The case according to claim 2, wherein the weakened line portion includes a slit.

5. The case according to claim 1, wherein the sealing seal portion is peelable from the case body, and when the sealing seal portion is peeled off, a peeling mark is transferred to a surface of the case body.

6. The case according to claim 1, wherein the seal includes an additional seal portion that is continuous with the sealing seal portion and is attachable to a portion on a surface of the case body, and the additional seal portion displays information relating to at least one of the plurality of components or the case.

7. The case according to claim 1, wherein the plurality of electronic components are rectangular or substantially rectangular parallelepiped electronic components.

8. The case according to claim 1, wherein each of the plurality of electronic components has a length of about 1.2 mm or less in a longitudinal direction.

9. The case according to claim 1, wherein the plurality of electronic components include capacitors or inductors.

10. The case according to claim 1, further comprising a sloped plate portion in the case body.

11. The case according to claim 10, wherein the sloped plate portion has a slope angle of about 3° or more and about 10° or less.

12. The case according to claim 1, wherein an RFID tag is stored in the case body.

13. The case according to claim 1, further comprising upper and rear grip portions on the case body.

14. The case according to claim 1, wherein the case body includes claw portions on a bottom surface thereof.

15. The case according to claim 1, wherein the shutter includes an elongated strip-shaped film.

16. The case according to claim 1, wherein the shutter is made of polyethylene terephthalate.

17. The case according to claim 1, wherein the shutter is wider than the discharge port.

18. The case according to claim 1, wherein the slider includes a stopper to position the shutter.

19. The case according to claim 1, wherein the slider cannot be accessed without peeling off and removing the sealing seal portion or tearing and breaking the sealing seal portion.

20. A seal attachable to a case that includes a case body including an accommodation space to accommodate a plurality of components and a discharge port to discharge the plurality of components accommodated in the accommodation space, a shutter slidably provided in the case body to open and close the discharge port, a slider integral with the shutter to perform a slide operation of the shutter, and an operation opening in the case body to expose the slider to outside to allow for operation of the slider, the seal comprising:

a sealing seal portion to cover and seal at least the operation opening; and an additional seal portion attachable to a portion on a surface of the case body; wherein the additional seal portion displays information relating to at least one of the plurality of components or the case.

* * * * *